(12) United States Patent
Aldea et al.

(10) Patent No.: US 11,879,620 B2
(45) Date of Patent: Jan. 23, 2024

(54) COMBINED SURFACE MOUNT STANDOFF AND LED FOR SPACE CONSTRAINED APPLICATIONS

(71) Applicant: Ciena Corporation, Hanover, MD (US)

(72) Inventors: Victor Aldea, Ottawa (CA); Michael Ledwinka, Ottawa (CA); Trevor Meunier, Kemptville (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/476,736

(22) Filed: Sep. 16, 2021

(65) Prior Publication Data
US 2023/0082599 A1 Mar. 16, 2023

(51) Int. Cl.
| | |
|---|---|
| *F21V 23/00* | (2015.01) |
| *H05K 3/30* | (2006.01) |
| *F21V 8/00* | (2006.01) |
| *F21Y 115/10* | (2016.01) |

(52) U.S. Cl.
CPC .......... *F21V 23/005* (2013.01); *G02B 6/0073* (2013.01); *H05K 3/303* (2013.01); *F21Y 2115/10* (2016.08); *H05K 2201/10106* (2013.01); *H05K 2201/10121* (2013.01)

(58) Field of Classification Search
CPC ... G02B 6/0073; G02B 6/4298; F21V 23/005; H05K 2201/10106; H05K 2201/10121; H05K 3/303
See application file for complete search history.

(56) References Cited

U.S. PATENT DOCUMENTS

| | | | | |
|---|---|---|---|---|
| 5,173,810 A | * | 12/1992 | Yamakawa | G02B 3/00 257/E33.072 |
| 6,039,460 A | * | 3/2000 | Ng | C02F 1/325 362/225 |
| 6,666,689 B1 | * | 12/2003 | Savage, Jr. | H01R 33/765 362/555 |
| 7,349,163 B2 | * | 3/2008 | Angelini | F21V 17/005 362/555 |
| 7,507,924 B2 | * | 3/2009 | Lorenzo Riera | H01H 13/023 200/341 |
| 8,348,489 B2 | * | 1/2013 | Holman | G02B 6/0031 349/111 |
| 8,573,823 B2 | * | 11/2013 | Dau | F21V 7/0016 362/560 |
| 8,632,218 B2 | * | 1/2014 | Park | F21V 5/045 362/277 |
| 8,764,264 B2 | * | 7/2014 | Knapp | G09F 7/18 362/604 |
| 9,295,178 B1 | | 3/2016 | Aldea et al. | |

(Continued)

*Primary Examiner* — Arman B Fallahkhair
(74) *Attorney, Agent, or Firm* — Clements Bernard Walker; Christopher L. Bernard

(57) ABSTRACT

A combination standoff and LED includes a surface mount solder standoff which can be either threaded or unthreaded, and a surface mount LED disposed and fixed in the center of the base of the standoff. The combination standoff and LED is adapted to receive a lightpipe via the either threaded or unthreaded portion of the surface mount solder standoff. This combination standoff and LED results in a single piece of hardware which simplifies the physical PCBA layout design and removes any Computer Aided Design (CAD) placement errors that would normally be present if two separate hardware components were placed together manually.

20 Claims, 7 Drawing Sheets

(56) References Cited

U.S. PATENT DOCUMENTS

| | | |
|---|---|---|
| 9,416,937 B2 * | 8/2016 | Windom .................. F21V 5/04 |
| 9,759,235 B2 | 9/2017 | Saturley et al. |
| 10,028,407 B2 | 7/2018 | Meunier et al. |
| 10,062,993 B1 | 8/2018 | Lutkiewicz et al. |
| 10,070,553 B2 | 9/2018 | Lee et al. |
| 10,509,180 B2 | 12/2019 | Meunier et al. |
| 10,533,731 B2 * | 1/2020 | Blandin .............. F21V 19/0015 |
| 10,638,631 B2 | 4/2020 | O'Leary et al. |
| 10,782,492 B2 | 9/2020 | Meunier et al. |
| 10,877,230 B1 | 12/2020 | Graham et al. |
| 10,877,260 B2 * | 12/2020 | Kang ................. G02B 23/2407 |
| 10,935,742 B2 | 3/2021 | Maniloff et al. |
| 10,939,536 B1 | 3/2021 | O'Leary et al. |
| 11,013,146 B2 | 5/2021 | Saturley et al. |
| 2010/0084959 A1 * | 4/2010 | Nam ........................ F21S 4/10<br>313/116 |
| 2012/0160642 A1 * | 6/2012 | Liao .................... H01H 13/023<br>200/310 |
| 2015/0146450 A1 * | 5/2015 | Iordache .............. G02B 6/0096<br>362/555 |
| 2015/0233388 A1 | 8/2015 | Saturley et al. |
| 2021/0364687 A1 * | 11/2021 | Wang .................. G02B 6/4262 |

\* cited by examiner

COMBINED SURFACE MOUNT STANDOFF AND LED FOR SPACE CONSTRAINED APPLICATIONS

FIELD OF THE DISCLOSURE

The present disclosure relates generally to PCB layout and component configuration. More particularly, the present disclosure relates to systems and methods for a combined surface mount standoff and LED for use in space constrained applications.

BACKGROUND OF THE DISCLOSURE

Space management, i.e., arranging electrical and mechanical components, is a growing challenge in modern computing hardware such as storage devices and networking hardware. This challenge is due to the ever-increasing capacity and density of components in computing hardware. As described herein, components include electrical and/or optical hardware mounted on a Printed Circuit Board Assembly (PCBA). Networking, computing, and/or storage devices are formed via hardware modules which include the PCBA, and which are typically disposed within a chassis, shelf, or the like, i.e., a hardware platform. A hardware module, or simply a module, may also be referred to as a circuit pack, a line module, a blade, etc. Modules are becoming increasingly smaller with less available space within, resulting in less space on the PCBA for component layout purposes. Because of smaller modules, PCBA designs are becoming significantly more compact resulting in a much denser arrangement of components thereon. As such, the reduction of hardware required to attach components such as a lightpipe to its source Light Emitting Diode (LED) is highly beneficial for both the physical space and computer aided PCBA design.

The present background is provided as illustrative environmental context only. It will be readily apparent to those of ordinary skill in the art that the principles and concepts of the present disclosure may be implemented in other environmental contexts equally, without limitation.

BRIEF SUMMARY OF THE DISCLOSURE

The present disclosure relates to a system and method for a combined surface mount standoff and light emitting diode (LED) for use in space constrained applications. In an embodiment, the combination standoff and LED includes a surface mount solder standoff which can be either threaded or unthreaded, and a surface mount LED disposed and fixed in the center of the base of the standoff. The combination standoff and LED is adapted to receive a lightpipe via the either threaded or unthreaded portion of the surface mount solder standoff. This combination standoff and LED results in a single piece of hardware which simplifies the physical PCBA layout design and removes any Computer Aided Design (CAD) placement errors that would normally be present if two separate hardware components were placed together manually.

In one illustrative embodiment, the present disclosure provides a combination standoff and light emitting diode (LED), including: a surface mount standoff having a base adapted to be disposed on a printed circuit board assembly (PCBA) and a cavity adapted to receive and secure an end of a lightpipe; and an LED disposed on the surface of the PCBA and in the center of the base of the surface mount standoff and aligned centrally under the cavity. The surface mount standoff includes one or more cavities adapted to receive and secure an end of one or more lightpipes, and wherein one or more LEDs are arranged along the cavities on the PCBA as to illuminate the lightpipes. The base of the surface mount standoff is adapted to allow the surface mount standoff to be soldered onto the PCBA to secure it to the surface of the PCBA. The surface mount standoff and the LED are collectively adapted to align and secure a light absorbing end of a lightpipe over the LED.

In another illustrative embodiment, the present disclosure provides a module for use in a hardware platform for networking, computing, and/or storage, the module including: an enclosure having a faceplate; a printed circuit board assembly (PCBA) disposed within the enclosure having electrical and/or optical components disposed on the surface of the PCBA; a lightpipe adapted to optically couple a light emitting diode (LED) disposed on the PCBA and the faceplate of the enclosure; a combination standoff and LED including a surface mount standoff having a base adapted to be disposed on a printed circuit board assembly (PCBA) and a cavity adapted to receive and secure an end of a lightpipe; and an LED disposed on the PCBA surface and in the center of the base of the surface mount standoff and aligned centrally under the cavity. The lightpipe extends from the combination standoff and LED to the faceplate of the enclosure and is disposed through the faceplate, the lightpipe being operable for transmitting light from the LED to the outside of the enclosure. The surface mount standoff includes one or more cavities to receive and secure an end of one or more lightpipes, and wherein one or more LEDs are arranged along the cavities on the PCBA as to illuminate the lightpipes. The base of the surface mount standoff is adapted to allow the surface mount standoff to be soldered onto the PCBA to secure it to the surface of the PCBA. The surface mount standoff and the LED are collectively adapted to align and secure a light absorbing end of a lightpipe over the LED.

In a further illustrative embodiment, the present disclosure provides a method for mounting a lightpipe in a module, the method including: placing a combination standoff and LED onto the surface of a printed circuit board assembly (PCBA), the combination standoff and LED including a surface mount standoff and an LED, while ensuring that the LED is positioned centrally under a cavity of the surface mount standoff; soldering the surface mount standoff and LED to the PCBA as to secure the surface mount standoff and LED in place and to provide power to the LED; and coupling a light absorbing end of a lightpipe to a cavity in the surface mount standoff and disposing a light emitting end of the lightpipe through a faceplate of a module enclosure.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

The present disclosure again relates to a system and method for a combined surface mount standoff and LED for use in space constrained applications. In an embodiment, the system and methods include a surface mount solder standoff which can be either threaded or unthreaded, and a surface mount LED disposed and fixed in the center of the base of the standoff. The combination standoff and LED is adapted to receive a lightpipe via the either threaded or unthreaded portion of the surface mount solder standoff. This combined surface mount standoff and LED results in a single piece of hardware which simplifies the physical PCBA layout design and removes any Computer Aided Design (CAD) placement errors that would normally be present if two separate hardware components were placed together manually.

The present disclosure provides a single electronically and mechanically placed component to receive a lightpipe to transmit light from a PCBA to an outer surface of a chassis, shelf, cabinet, or other enclosure of the like. A lightpipe is a physical structure that is used to transmit light lengthwise along its span. Lightpipes are a widely used option to transmit light from one location to another inside of modules such as networking, computing, and/or storage devices. Current lightpipe mounting techniques take up a large amount of space on a PCBA and are increasingly difficult to incorporate in component dense modules. This is due to the current state of the art requiring separate threaded solder standoffs to be placed a certain distance away from the LED for screws to be used to mount the lightpipe. This results in the use of considerably more physical space which is becoming next to impossible with current module designs as the space constraints and performance demands of products has increased significantly.

By allowing the lightpipe to be secured directly to a single standoff centered directly over the LED, no additional mechanical space or PCBA layout space is required to secure the lightpipe, allowing the saved space to be used to increase module density or to place additional mechanical or electrical components. By additionally designing this combination standoff and LED so that it is placed in as one single component as seen by various electrical CAD packages, design time is also reduced further than if these two parts were placed as two individual components.

Figure 1:
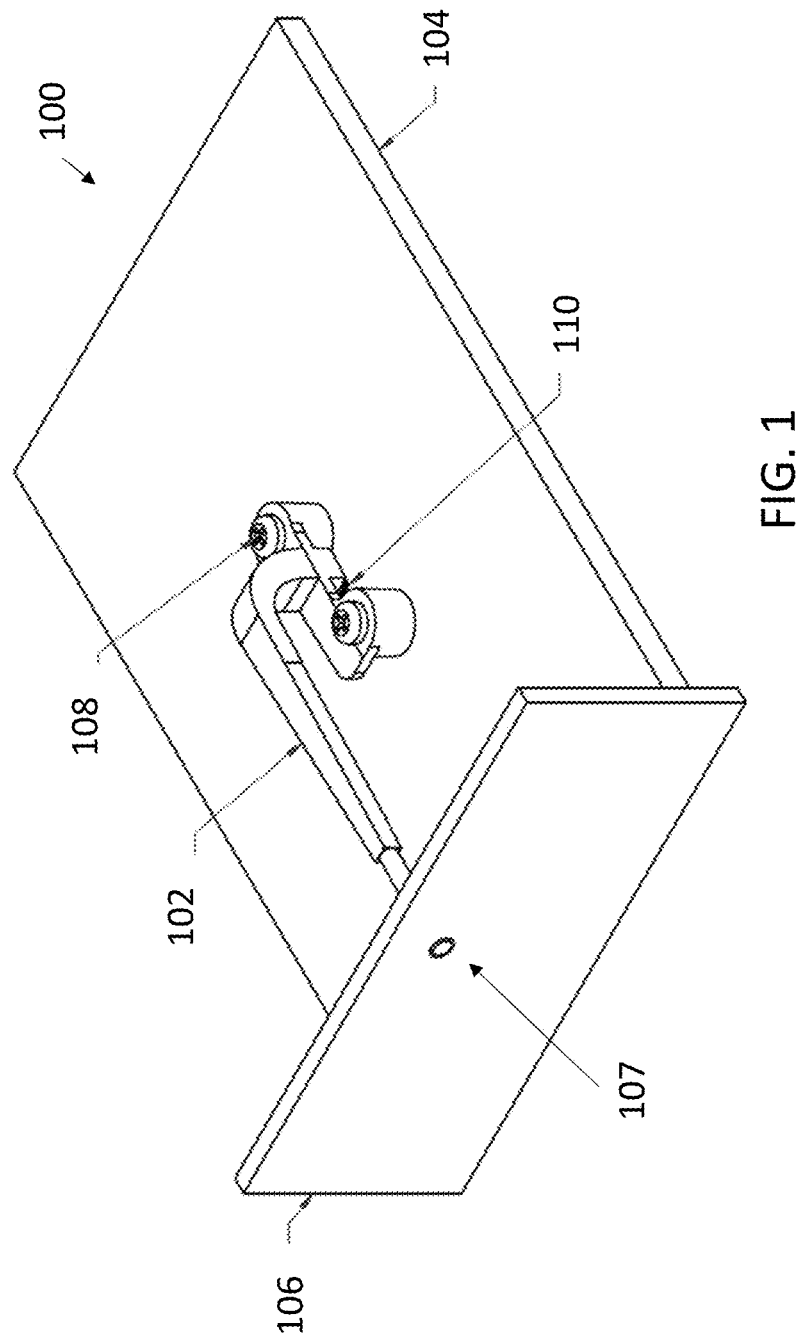
FIG. 1 is a perspective diagram of an example module illustrating a lightpipe mounted to a PCBA.
Figure 2:
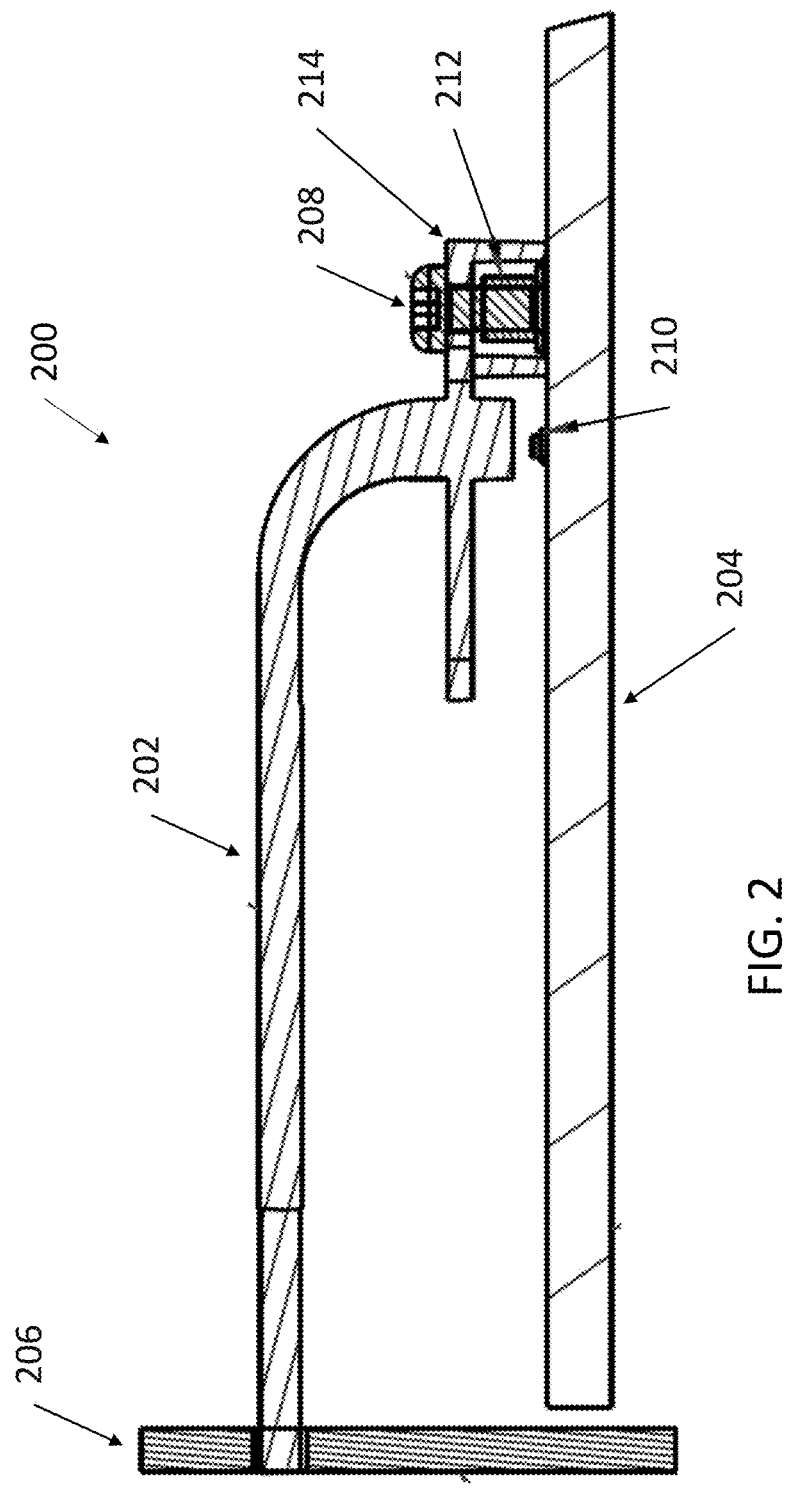
FIG. 2 is a section view diagram of the example module illustrating the lightpipe mounted to the PCBA.

Referring now specifically to FIG. 1, a prospective diagram of an example module 100 illustrating a lightpipe 102 mounted to a PCBA 104 is presented. The module 100 presented in FIG. 1 includes a PCBA 104 which may be mounted inside of a chassis, shelf, cabinet, or other enclosure of the like. A faceplate 106 of a chassis, shelf, cabinet, or other enclosure of the like is also illustrated and includes a hole 107 to receive a light emitting end of the lightpipe 102. The lightpipe 102 is mounted to the PCBA 104 via a plurality of screws 108 and threaded solder standoffs 212 (FIG. 2). The threaded solder standoffs 212 are placed in specific locations on the surface of the PCBA 104 to allow the light absorbing end of the lightpipe 102 to be positioned above an LED 110. The threaded solder standoffs 212 must also be placed far enough away from the LED 110 as to allow sufficient room for the screws 108 to be installed. This configuration takes up a significant amount of space on the PCBA 104 that could alternatively be used for additional mechanical or electrical components.

The lightpipe 102 is shown extending from the location of the LED 110 to the faceplate 106 of a chassis, shelf, cabinet, or other enclosure of the like. The distal end (light emitting end) of the lightpipe 102 is disposed through the hole 107 in the faceplate 106 as to allow the distal end to be seen from the outside of the module 100, thus allowing the light emitted from the LED 110 to also be seen from outside of the module. It will be known that the faceplate 106 may be any face of the enclosure that is visible from the outside of the module 100 enclosure. Because the PCBA 104 is mounted inside of a chassis, shelf, cabinet, or other enclosure of the like, and because of the location and orientation of the LED 110 on the PCBA 104, this lightpipe 102 is necessary to allow the light emitted from the LED 110 to be seen from outside of the module without opening the enclosure. With this said, the lightpipe mounting configuration shown in FIG. 1 takes up a significant amount of space on the PCBA 104, thus taking up space that could alternatively be used for additional mechanical or electrical components.

Referring now specifically to FIG. 2, a section view diagram of the example module 200 illustrating the lightpipe 202 mounted to the PCBA 204 is illustrated. An LED 210 is disposed on the surface of the PCBA 204 and secured with solder or other similar method of attaching components to circuit boards know to one of ordinary skill in the art. this LED 210 being configured to transmit visual alerts or status conditions of the module 200 when in use or standby. Because the PCBA 204 on which the LED 210 is enclosed within a chassis, shelf, cabinet, or other enclosure of the like, a lightpipe 202 is used to transmit the light from the LED 210 to the outside of the module 200. Lightpipes are widely used to redirect light in modules such as networking, computing, and/or storage devices when an LED must be visible from outside of the module. FIG. 2 illustrates how the lightpipe 202 can redirect the light emitted from the LED 210 to the outside of the faceplate 206. This allows the visual signals from the LED 210 to be seen from outside of the module 200. The light absorbing end of the lightpipe 202 must be accurately positioned over the LED 210 for the assembly to operate correctly and properly transmit the light to the opposite end of the lightpipe 202. The currently illustrated lightpipe 202 includes a flange 214 which extends outward from the lightpipe 202 and is adapted to be used to fix the lightpipe 202 to the PCBA 204 via a plurality of screws 208. In order for the screws 208 to be used to fix the lightpipe 202 securely to the PCBA 204, a plurality of threaded solder standoffs 212 must be mounted to the PCBA 204 in a predetermined arrangement and distance from the LED 210 for the lightpipe 202 to be aligned correctly over the LED 210 and efficiently transmit the light to the outside of the faceplate 206 of the module 200.

The mounting style illustrated in FIG. 2 again introduces a problem due to the threaded solder standoffs 212 required for the mounting of the lightpipe 202. This configuration uses a considerable amount of physical mechanical space because of the flange 214 used to mount the lightpipe 202, as well as PCBA layout space because of the threaded solder standoffs 212 used here, as they must be placed a certain distance from the LED 210 to allow them to be secured using screws 208. The additional space required by this mounting configuration has become next to impossible to obtain within current module designs, as the space constraints and performance demands of products such as networking, computing, and/or storage devices has increased significantly in recent years.

Figure 3:
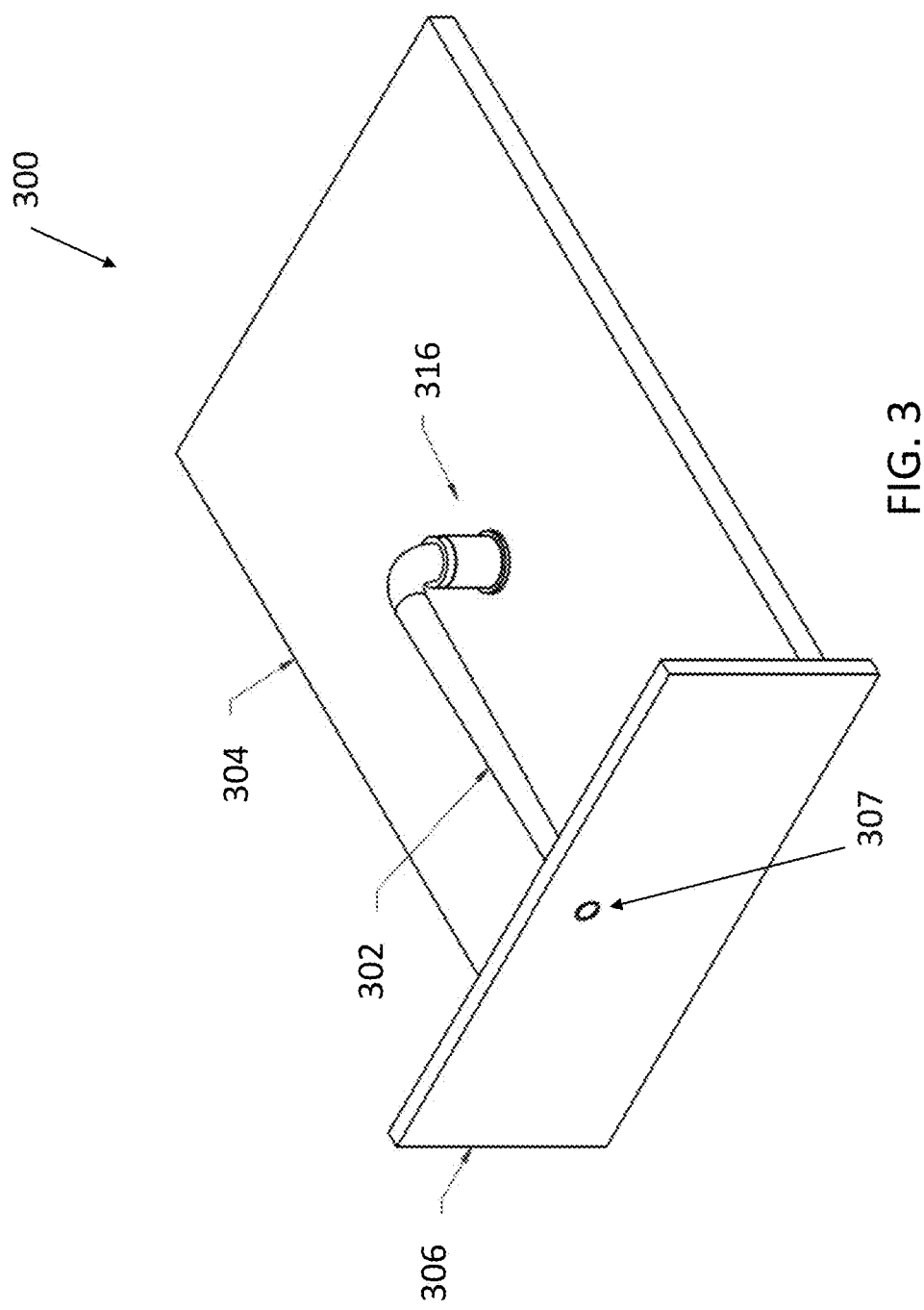
FIG. 3 is a perspective diagram of an example module illustrating a lightpipe and combination standoff and LED.

Referring now specifically to FIG. 3, a prospective diagram of another example module 300 illustrating a lightpipe 302 and combination standoff and LED 316 is shown. The module 300 presented in FIG. 3 includes a PCBA 304 which may be mounted inside of a chassis, shelf, cabinet, or other enclosure of the like. A faceplate 306 of a chassis, shelf, cabinet, or other enclosure of the like is also illustrated and includes a hole 307 to receive a light emitting end of the lightpipe 302. The lightpipe 302 is mounted to the PCBA 304 via the combination standoff and LED 316.

The combination standoff and LED 316 of the current disclosure is a single electronically and mechanically placed component made up of a surface mount standoff 418 (FIG. 4) and an LED 410 (FIG. 4) disposed in the center of the surface mount standoff 418. This combination standoff and LED 316 is adapted to receive and secure the light absorbing end of a lightpipe 302 while simultaneously ensuring that the light absorbing end of the lightpipe 302 is positioned correctly over the LED 410. A lightpipe 302 can be either press-fit, threaded, or glued into the combination standoff and LED 316 by way of attachment and then transmits light from the LED 410 to the faceplate 306 without having to be fastened to the PCBA 304 by any other means. It will be known that the faceplate 306 may be any face of the enclosure that is visible from the outside of the module 300 enclosure.

The present disclosure allows the lightpipe 302 to be secured directly to a single surface mount standoff 418 centered directly over the LED 410. With this configuration, no additional mechanical space or PCBA 304 layout space is required to secure it, allowing that saved space to be utilized to increase module 300 density or place additional mechanical or electrical components on the PCBA 304. Additionally, when designing PCBA layouts using electrical CAD software, it can be difficult to place such components together and will result in placement errors. By additionally designing this combination standoff and LED 316 so that it is placed in as one single component as seen by an electrical CAD package, design time is also reduced further than if the surface mount standoff 418 and LED 410 were placed as two individual components as they are illustrated in FIG. 1 and FIG. 2. The combined footprint of the combination standoff and LED 316 changes the clearances and waives some of the restrictions so as not to produce errors in the electrical CAD layout process, and ensure that solder paste is correctly applied in the correct locations on the PCBA 304 once the circuit design is established.

Figure 4:
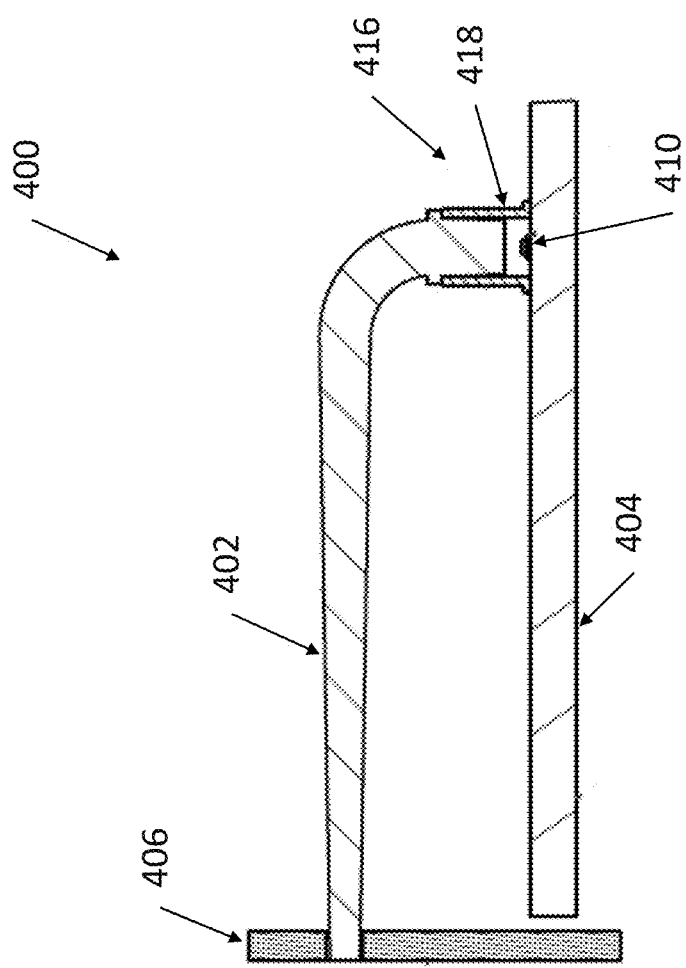
FIG. 4 is a section view diagram of the example module illustrating the lightpipe and combination standoff and LED.

Referring now specifically to FIG. 4, a section view diagram of the example module 400 illustrating the lightpipe 402 and combination standoff and LED 416 is shown. The individual components of the combination standoff and LED 416 can be seen and includes the surface mount standoff 418 and LED 410. The LED 410 is disposed in the center of the base surface 620 (FIG. 6) of the surface mount standoff 418 with its solder points exposed as to allow the LED 410 to be powered by the PCBA 404. The surface mount standoff 418 is fixed to the PCBA 404 with solder or any other form of PCBA attachment known to one of ordinary skill in the art via the base surface 620. The surface mount standoff 418 of the combination standoff and LED 416 of the present disclosure is cylindrical in shape and includes a cavity 524 (FIG. 5) disposed through its center to allow the light absorbing end of a lightpipe 402 to be secured inside of the surface mount standoff 418. The lightpipe 402 can be either press-fit, threaded, or glued into the cavity 524 (FIG. 5) portion of the surface mount standoff 418 for attachment. The surface mount standoff 418 portion of the combination standoff and LED 416 may also take any shape as to accommodate and secure any lightpipe 402.

Having the LED disposed in the center of the base surface 620 of the surface mount standoff 418 allows the lightpipe 402 to be secured directly to the single surface mount standoff 418 centered directly over the LED 410. With this configuration, no other form of securement such as additional standoffs and screws is necessary to fix the lightpipe 402 in place, thus requiring no additional mechanical space or PCBA 404 layout space to secure it, again, allowing the saved space to be utilized to increase module 400 density or place additional mechanical or electrical components on the PCBA 404.

The lightpipe 402 is shown extending from the location of the combination standoff and LED 416 to the faceplate 406 of a chassis, shelf, cabinet, or other enclosure of the like. The distal end (light emitting end) of the lightpipe 402 is disposed through the faceplate 406 as to allow the distal end to be seen from the outside of the module, thus allowing the light emitted from the LED 410 to also be seen from outside of the module. Because the PCBA 404 is mounted inside of a chassis, shelf, cabinet, or other enclosure of the like, and because of the location and orientation of the LED 410 on the PCBA 404, this lightpipe is necessary to allow the light emitted from the LED 410 to be seen from outside of the module without opening the enclosure.

Figure 5:
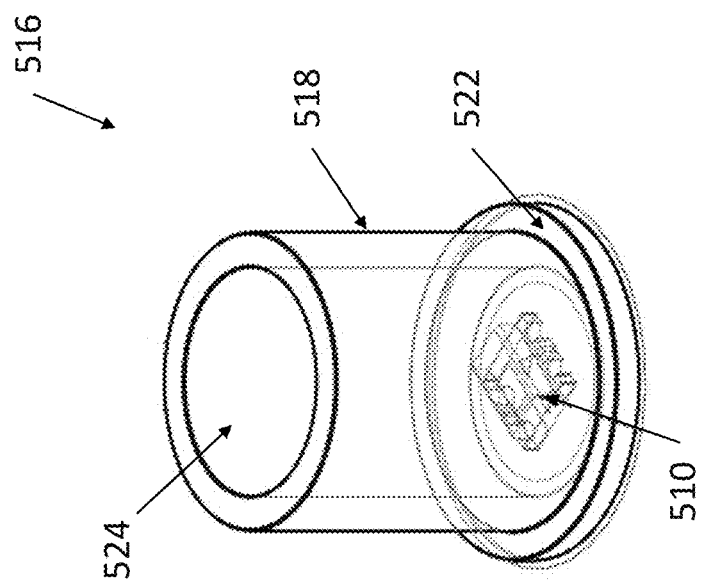
FIG. 5 is a top perspective view diagram illustrating the combination standoff and LED of the present disclosure.

Referring now specifically to FIG. 5, a top prospective view diagram illustrating the combination standoff and LED 516 of the present disclosure is shown. The combination standoff and LED 516 again includes the surface mount standoff 518 and the LED 510. The LED 510 is disposed in the center of a base 522 of the surface mount standoff 518 and positioned in the center of the cavity 524 with its solder points exposed as to allow the LED 510 to be mounted to and powered by the PCBA 404. The surface mount standoff 518 again includes a base 522 which extends out from the body of the surface mount standoff 518. This base 522 is adapted to be fixed to the PCBA 404 with solder or any other form of PCBA attachment known to one of ordinary skill in the art via the base surface 620. The surface mount standoff 418 of the combination standoff and LED 416 of the present disclosure is cylindrical in shape and includes a cavity 524 disposed through its center to allow the light absorbing end of a lightpipe 402 to be secured inside of the surface mount standoff 518. The lightpipe 402 (FIG. 4) can be either press-fit, threaded or glued into the cavity 524 portion of the surface mount standoff 518 for attachment. The current illustrated embodiment includes a cavity 524 which is smooth. Other embodiments may include threads located on the inside of this cavity 524 to receive and secure an externally threaded end of a lightpipe. In further embodiments the surface mount standoff may also include threads on its outer surface to receive and secure an internally threaded end of a lightpipe. The surface mount standoff 518 portion of the combination standoff and LED 516 may be manufactured from metal or any similar material suitable for the purpose. More importantly, the material may be adapted to allow the base surface 620 of the surface mount standoff 518 to be soldered to a PCBA for attachment or may be adapted to allow the surface mount standoff 518 to be attached to the PCBA with any other method known to one of ordinary skill in the art.

It will be appreciated that other embodiments of the combination standoff and LED 516 may be adapted to accommodate a plurality of lightpipes. Therefore, the surface mount standoff 518 may be any shape and may include a plurality of cavities to accommodate any number of lightpipes. It will also be appreciated that any number of LEDs 510 may be arranged along the cavities as to transmit light along one or more lightpipes.

Figure 6:
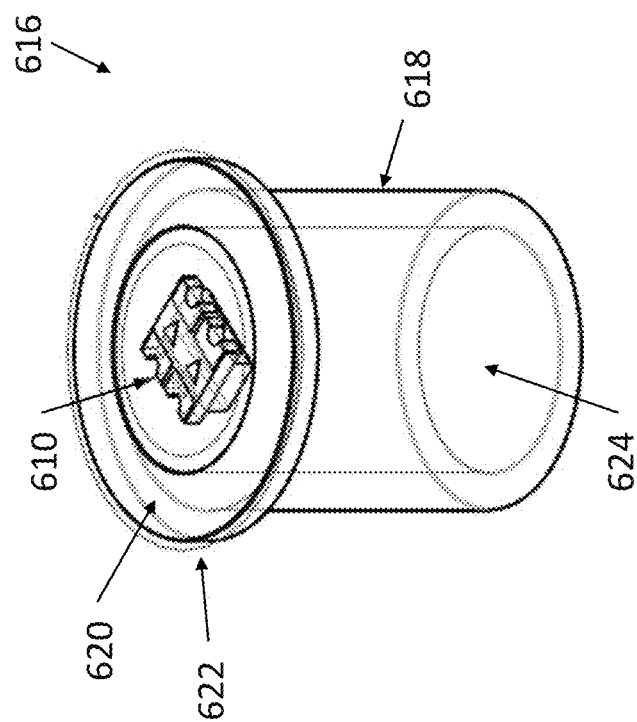
FIG. 6 is a bottom perspective view diagram illustrating the combination standoff and LED of the present disclosure.

Referring now specifically to FIG. 6, a bottom prospective view diagram illustrating the combination standoff and LED 616 of the present disclosure is shown. The base surface 620 is adapted to be soldered to a PCBA but may be adapted to accommodate any other method of attaching components to a PCB known to one of ordinary skill in the art. The LED 610 is again disposed in the center of the base 622 and positioned in the center of the cavity 624 to allow the LED 610 to be aligned with the light absorbing end of a lightpipe.

Again, it will be appreciated that other embodiments of the combination standoff and LED 616 may be adapted to accommodate a plurality of lightpipes. Therefore, the surface mount standoff 618 may be any shape and may include a plurality of cavities to accommodate any number of lightpipes. It will also be appreciated that any number of LEDs 610 may be arranged along the cavities as to transmit light along one or more lightpipes.

Figure 7:
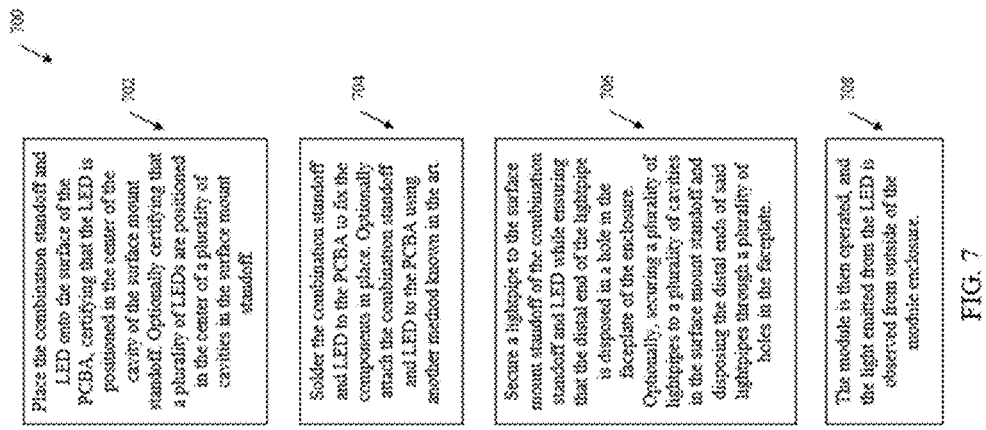
FIG. 7 is a flow diagram illustrating the method of installing the lightpipe and combination standoff and LED.

Referring now specifically to FIG. 7, a flow diagram illustrating the method of installing the lightpipe and combination standoff and LED is shown. As stated before, a common method of mounting a lightpipe over an LED on a PCBA is by arranging a plurality of solder standoffs around the LED and securing the lightpipe to the standoffs with screws. This takes up a large amount of space on the surface of the PCBA as well as inside of the module chassis, shelf, cabinet, or other enclosure of the like. This is because the plurality of solder standoffs need to be placed at a far enough distance from the LED to allow screws to be used to secure the flange of the lightpipe. The combination standoff and LED of the present disclosure not only eliminates the plurality of standoffs placed around the LED, but also eliminates the need for screws and a lightpipe flange.

The method 700 for installing the combination standoff and LED of the present disclosure is described in FIG. 7. The combination standoff and LED may again include a surface mount standoff and an LED, the surface mount standoff further including a cavity and a base. These two components are placed onto the surface of a PCBA while ensuring that the LED is centered under the cavity in the surface mount standoff. This procedure may be altered if the PCBA is designed, for example in an electronic CAD software package, and includes predetermined solder points, in which the location of the surface mount standoff and LED must be considered in the PCBA layout design before placing the components onto the PCBA. Optionally, if the surface mount standoff includes a plurality of cavities, a plurality of LEDs must be placed on the surface of the PCBA and positioned under the plurality of cavities in the surface mount standoff to allow the light emitted from the LEDs to pass through the corresponding cavities. The surface mount standoff and LED are then soldered to the surface of the PCBA to attach the components to the PCBA and supply power to the LED. Alternatively, the components may be attached to the surface of the PCBA using another method known in the art. A lightpipe is then secured to the surface mount standoff of the combination standoff and LED while ensuring that the distal end (light emitting end) of the lightpipe is disposed through a hole in the faceplate of the enclosure. The light absorbing end of the lightpipe is secured to the combination standoff and LED by either threading, press fitting, or gluing the light absorbing end of the lightpipe onto the surface mount standoff via the cavity. Alternatively, a plurality of lightpipes may be secured to a plurality of cavities in the surface mount standoff and the distal ends of the lightpipes disposed through a plurality of holes in the faceplate. The module is then operated, and the light emitted from the LED is observed from outside of the module enclosure.

Although the present disclosure is illustrated and described herein with reference to illustrative embodiments and specific examples thereof, it will be readily apparent to those of ordinary skill in the art that other illustrative embodiments and examples may perform similar functions and/or achieve like results. All such equivalent illustrative embodiments and examples are within the spirit and scope of the present disclosure, are contemplated thereby, and are intended to be covered by the following non-limiting claims for all purposes.

What is claimed is:

1. A combination standoff and light emitting diode (LED) comprising:
    a cylindrical surface mount standoff including a cylindrical wall defining a cylindrical cavity and having on one end a base adapted to be disposed on a printed circuit board assembly (PCBA) and on another end a circular opening to the cylindrical cavity adapted to receive a cylindrical light absorbing end of a lightpipe through the circular opening from the another end and into the cylindrical cavity; and
    an LED located at the base of the surface mount standoff and aligned within the cylindrical cavity such that the LED is adapted to be aligned with the cylindrical light absorbing end of the lightpipe within the cylindrical cavity, wherein points of the LED for making electrical contact with the PCBA are surrounded by the base and exposed to the PCBA through a base surface of the base, and wherein the surface mount standoff and the LED are adapted to be fixed to the PCBA as a single component,
    wherein the one end of the cylindrical wall surrounds the LED, and the another end of the cylindrical wall defines the circular opening, the cylindrical wall extending from the base to the circular opening.

2. The combination standoff and LED of claim 1, wherein the surface mount standoff further comprises one or more additional cavities, each configured as the cylindrical cavity, and one or more additional lightpipes, each configured as the lightpipe, each additional cavity adapted to receive and secure an end of an associated additional lightpipe, and wherein an additional LED, configured as the LED, is arranged along each of the additional cavities on the PCBA as to illuminate the associated additional lightpipe.

3. The combination standoff and LED of claim 1, wherein the base of the surface mount standoff is adapted to expose solder points of the LED, and wherein the base of the surface mount standoff is adapted to be soldered onto the PCBA to secure the surface mount standoff and the LED to the surface of the PCBA.

4. The combination standoff and LED of claim 1, wherein the cylindrical cavity is internally threaded to receive and secure external threads of the cylindrical light absorbing end of the lightpipe.

5. The combination standoff and LED of claim 1, wherein the cylindrical cavity is adapted to receive the cylindrical light absorbing end of the lightpipe the lightpipe by way of a press fit or glued attachment.

6. The combination standoff and LED of claim 1, wherein the cylindrical cavity permits rotation of the cylindrical light absorbing end of the lightpipe within the cylindrical cavity such that a light emitting end of the lightpipe may be aligned with and disposed through a hole in a faceplate of a module enclosure.

7. The combination standoff and LED of claim 1, wherein the cylindrical wall defines a constant internal diameter between the one end and the another end.

8. The combination standoff and LED of claim 1, wherein the cylindrical wall extends along its centerline from the base to the circular opening.

9. The combination standoff and LED of claim 1, wherein a lower surface of the cylindrical wall at the one end is in contact with the base.

10. The combination standoff and LED of claim 1, wherein the base extends from an exterior surface of the cylindrical wall perpendicular to the exterior surface of the cylindrical wall.

11. The combination standoff and LED of claim 1, wherein the cylindrical wall is configured to directly couple with the lightpipe.

12. A module for use in a hardware platform for networking, computing, or storage, the module comprising:
  an enclosure having a faceplate;
  a printed circuit board assembly (PCBA) disposed within the enclosure having electrical or optical components disposed on a surface of the PCBA;
  a lightpipe adapted to optically couple a light emitting diode (LED) disposed on the PCBA with the faceplate of the enclosure;
  a combination standoff and LED including:
    a cylindrical surface mount standoff including a cylindrical wall defining a cylindrical cavity and having on one end a base adapted to be disposed on the PCBA and on another end a circular opening to the cylindrical cavity adapted to receive a cylindrical light absorbing end of the lightpipe through the circular opening from the another end and into the cylindrical cavity; and
    the LED located at the base of the surface mount standoff and aligned within the cylindrical cavity such that the LED is adapted to be aligned with the cylindrical light absorbing end of the lightpipe within the cylindrical cavity, wherein points of the LED for making electrical contact with the PCBA are surrounded by the base and exposed to the PCBA through a base surface of the base, and wherein the surface mount standoff and the LED are adapted to be fixed to the PCBA as a single component,
    wherein the one end of the cylindrical wall surrounds the LED, and the another end of the cylindrical wall defines the circular opening, the cylindrical wall extending from the base to the circular opening.

13. The module of claim 12, wherein the lightpipe extends from the combination standoff and LED to the faceplate of the enclosure and is disposed through the faceplate, wherein the lightpipe is configured to transmit light from the LED to the outside of the enclosure.

14. The module of claim 12, wherein the base of the surface mount standoff is adapted to expose solder points of the LED, and wherein the base of the surface mount standoff is adapted to be soldered onto the PCBA to secure the surface mount standoff and the LED to the surface of the PCBA.

15. The module of claim 12, wherein the cylindrical cavity is internally threaded to receive and secure external threads of the cylindrical light absorbing end of the lightpipe.

16. The module of claim 12, wherein the cylindrical cavity is adapted to receive the cylindrical light absorbing end of the lightpipe the lightpipe by way of a press fit or glued attachment.

17. A method for mounting a lightpipe in a module, the method comprising:
  placing a combination of standoff and LED onto the surface of a printed circuit board assembly (PCBA), wherein
    the combination of standoff and LED comprises a surface mount standoff and LED,
    the LED is located at a base surface of the surface mount standoff, ensuring that the LED is positioned under a cylindrical cavity defined by a cylindrical wall of the surface mount standoff, the cylindrical wall extending from a base at one end of the cylindrical wall to another end of the cylindrical wall defining a circular opening, wherein the one end of the cylindrical wall surrounds the LED, and
    points of the LED for making electrical contact with the PCBA are surrounded by and exposed to the PCBA through the base surface;
  attaching the surface mount standoff and LED to the PCBA as a single component to secure the surface mount standoff and LED in place and to provide power to the LED;
  disposing a cylindrical light absorbing end of a lightpipe through the circular opening and into the cylindrical cavity of the surface mount standoff;
  aligning and disposing a light emitting end of the lightpipe with and through a hole in a faceplate of a module enclosure; and
  securing the cylindrical light absorbing end of the lightpipe in the cylindrical cavity of the surface mount standoff such that the LED is aligned with the cylindrical light absorbing end of the lightpipe within the cylindrical cavity.

18. The method of claim 17, wherein the cylindrical cavity is internally threaded to receive and secure external threads of the cylindrical light absorbing end of the lightpipe, and wherein the method further includes threading the lightpipe into the surface mount standoff.

19. The method of claim 17, wherein the cylindrical cavity is adapted to receive the cylindrical light absorbing end of the lightpipe by way of a press fit or glued attachment, and wherein the method further includes press fitting or gluing the lightpipe into the surface mount standoff.

20. The method of claim 17, wherein aligning and disposing the light emitting end of the lightpipe with and through the hole in a faceplate of the module enclosure is done by rotation of the cylindrical light absorbing end of the lightpipe in the cylindrical cavity of the surface mount standoff.

* * * * *